United States Patent
Zhang et al.

(10) Patent No.: US 10,141,244 B2
(45) Date of Patent: Nov. 27, 2018

(54) TSV LAYOUT STRUCTURE AND TSV INTERCONNECT STRUCTURE, AND FABRICATION METHODS THEREOF

(71) Applicant: Semiconductor Manufacturing International (Shanghai) Corporation, Shanghai (CN)

(72) Inventors: Wuzhi Zhang, Shanghai (CN); Xiaojun Chen, Shanghai (CN); Xuanjie Liu, Shanghai (CN); Haifang Zhang, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 429 days.

(21) Appl. No.: 14/181,862

(22) Filed: Feb. 17, 2014

(65) Prior Publication Data

US 2014/0291856 A1  Oct. 2, 2014

(30) Foreign Application Priority Data

Mar. 28, 2013 (CN) .......................... 2013 1 0106719

(51) Int. Cl.
*H01L 21/44* (2006.01)
*H01L 23/48* (2006.01)
*H01L 21/768* (2006.01)

(52) U.S. Cl.
CPC ...... *H01L 23/481* (2013.01); *H01L 21/76898* (2013.01); *H01L 2924/0002* (2013.01)

(58) Field of Classification Search
CPC ............. H01L 23/485; H01L 21/76877; H01L 21/76837; H01L 23/481; H01L 21/768; H01L 21/486; H01L 21/76802
(Continued)

(56) References Cited

U.S. PATENT DOCUMENTS 8,618,651 B1*  12/2013  Yee ........................ H01L 21/486
                                                                257/698
2010/0133660 A1*  6/2010  Huyghebaert .... H01L 21/76802
                                                                257/621
(Continued)

OTHER PUBLICATIONS

Hsieh et al., TSV Redundancy: Architecture and Design Issues in 3-D IC, IEEE Trans. on VLSI Systems, vol. 20, No. 4, Apr. 2012, 711-722.*
(Continued)

*Primary Examiner* — Jack Chen
(74) *Attorney, Agent, or Firm* — Anova Law Group, PLLC

(57) ABSTRACT

TSV layout structure and TSV interconnect structure, and their fabrication methods are provided. An exemplary TSV interconnect structure includes a semiconductor substrate having a first region and a second region; and a plurality of through-holes disposed in the first region and the second region of the semiconductor substrate. An average through-hole density of the first region is greater than an average through-hole density of the entire semiconductor substrate. The average through-hole density of the entire semiconductor substrate is less than or equal to about 2%. A metal layer having a planarized surface is filled in the plurality of through-holes in the semiconductor substrate.

12 Claims, 3 Drawing Sheets

---

| Provide a semiconductor substrate including a first region and a second region | S11 |

| Form a plurality of through-holes in both the first region and the second region | S12 |

| Form a metal layer to fill the plurality of through-holes in the semiconductor substrate | S13 |

| Planarize the metal layer to form a TSV interconnect structure | S14 |

(58) Field of Classification Search
USPC ............... 257/E21.577, E23.145, 751, 758,
257/774–776, 698, 99, 621, 630;
438/629, 637, 639, 640, 667, 668, 672,
438/675, 700, 701, 713, 978, 638, 692,
438/693, 630
See application file for complete search history.

(56) References Cited

U.S. PATENT DOCUMENTS

| | | | | |
|---|---|---|---|---|
| 2011/0294293 | A1* | 12/2011 | Wang | B24B 37/044 |
| | | | | 438/692 |
| 2012/0007132 | A1* | 1/2012 | Chang | H01L 21/486 |
| | | | | 257/99 |
| 2013/0109181 | A1* | 5/2013 | Guo | C09G 1/04 |
| | | | | 438/693 |
| 2013/0252416 | A1* | 9/2013 | Takeda | H01L 21/486 |
| | | | | 438/630 |

OTHER PUBLICATIONS

Khor et al., Modelling and analysis of the effect of stacking chips with TSVs in 3D IC package encapsulation process, Maejo Int. J. Sci. Technol. 2012, 6(02), 159-185.*

* cited by examiner

TSV LAYOUT STRUCTURE AND TSV INTERCONNECT STRUCTURE, AND FABRICATION METHODS THEREOF

CROSS-REFERENCES TO RELATED APPLICATIONS

This application claims priority to Chinese Patent Application No. CN201310106719.9, filed on Mar. 28, 2013, the entire contents of which are incorporated herein by reference.

FIELD OF THE DISCLOSURE

The present disclosure generally relates to the field of semiconductor manufacturing technology and, more particularly, relates to TSV (i.e., through silicon via) layout structures and TSV interconnect structures and methods of fabricating the TSV layout structures and the TSV interconnect structures.

BACKGROUND

The critical dimension (CD) of semiconductor devices becomes very small along the development of semiconductor technology, and integrating more semiconductor devices in a two dimensional (2D) package structure becomes much more difficult. A three dimensional package structure becomes an effective way to achieve a higher integration. The 3D package technology includes: die stacking and package stacking, both based on gold wire bonding, and TSV-based 3D package structure. The advantages of TSV-based 3D package technology include high density integration, significant reduction of electrical interconnect length for solving signal delay and other problems occurring in the 2D system-on-chip (SOC) technology, and capability to use TSV technology to integrate chips of various functions (e.g., radio frequency, memory, logics, MEMS, etc.) to fabricate a multifunctional package chip. Hence, the 3D stacking technology based on the TSV interconnect structure becomes a popular chip package technology.

Currently, the fabrication method of the TSV interconnect structure includes providing a semiconductor substrate; depositing a mask layer on the semiconductor substrate, the mask layer having openings corresponding to subsequently formed through vias; etching the semiconductor substrate along the openings to create TSVs inside the semiconductor substrate; forming a copper layer by an electroplating process on the surface of the mask layer as well as the sidewall and the bottom surface of the through vias to fill the through vias; planarizing the copper layer by a chemical mechanical polishing process; removing extra copper layer deposited outside the through vias and the openings; and forming an interconnect structure inside the silicon through vias (TSVs).

However, when thinning the copper layer by the chemical mechanical polishing, copper residues often remain on the mask layer. This affects stability of the formed copper interconnect structure.

BRIEF SUMMARY OF THE DISCLOSURE

One aspect of the present disclosure includes a method of fabricating a TSV interconnect structure by providing a semiconductor substrate including a first region and a second region. A plurality of through-holes is formed in both the first region and the second region. An average through-hole density of the first region is greater than an average through-hole density of the entire semiconductor substrate and the average through-hole density of the entire semiconductor substrate is less than or equal to about 2%. A metal layer is formed to fill the plurality of through-holes in the semiconductor substrate and planarized by a chemical mechanical polishing process to form a TSV interconnect structure.

Another aspect of the present disclosure includes a TSV interconnect structure. The TSV interconnect structure includes a semiconductor substrate including a first region and a second region; and a plurality of through-holes disposed in the first region and the second region of the semiconductor substrate. An average through-hole density of the first region is greater than an average through-hole density of the entire semiconductor substrate and the average through-hole density of the entire semiconductor substrate is less than or equal to about 2%. A metal layer is filled in the plurality of through-holes in the semiconductor substrate and has a planarized surface.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

When thinning a copper layer by a chemical mechanical process, the region with a high density of TSVs (e.g., having more TSVs on a unit area) tends to generate more copper residues on the surface than the region with a low density of TSVs (e.g., having less TSVs on a unit area). This can be because the region with a high density of TSVs contains more TSVs and thus more copper filled in the through vias. Material hardness of the region with a high density of TSVs can be smaller than the material hardness of the region with a low density of TSVs. The smaller the material hardness of a region, the smaller the friction force induced during the chemical mechanical polishing process and the lower the polishing rate of such region. Thus the polishing rate of the copper layer on the surface of the mask layer in a region with a high density of TSVs is lower than that on the surface of the mask layer in a region with a low density of TSVs, when the copper layer is removed from the surface of the mask layer by a chemical mechanical polishing process. A difference of polishing rates then occurs between the region with a high density of TSVs and the region with a low density of TSVs.

As a result, when the copper layer in one region is completely removed from the surface, copper residues are still remained in the other region. Although the copper residues in the other region can be removed by extending time for the chemical mechanical polishing, copper layer in the other region may be overly polished to create undesirably big dents on the surface of the copper layer inside the through vias. This adversely affects surface uniformity of the TSV interconnect structure.

Further observation demonstrates that the higher the density of TSVs in a region with a high density of TSVs or the higher the density difference of TSVs between a region with a high density of TSVs and a region with a low density of TSVs, the more copper residues remain on the surface of the region with a high density of TSVs.

Disclosed herein provides TSV layout structures and TSV interconnect structures and methods of forming the TSV layout structures and the TSV interconnect structures. The difference in polishing rates due to the density difference of TSVs in different regions can be reduced during the chemical mechanical polishing process, e.g., by determining or controlling a relationship between an average density of TSVs in the semiconductor substrate and a density of TSVs in one region (e.g., a first region) of the semiconductor device. This can reduce or eliminate remaining metal residues after polishing and can provide surface uniformity of the TSV interconnect structure with enlarged latitude for processing.

Figure 4:
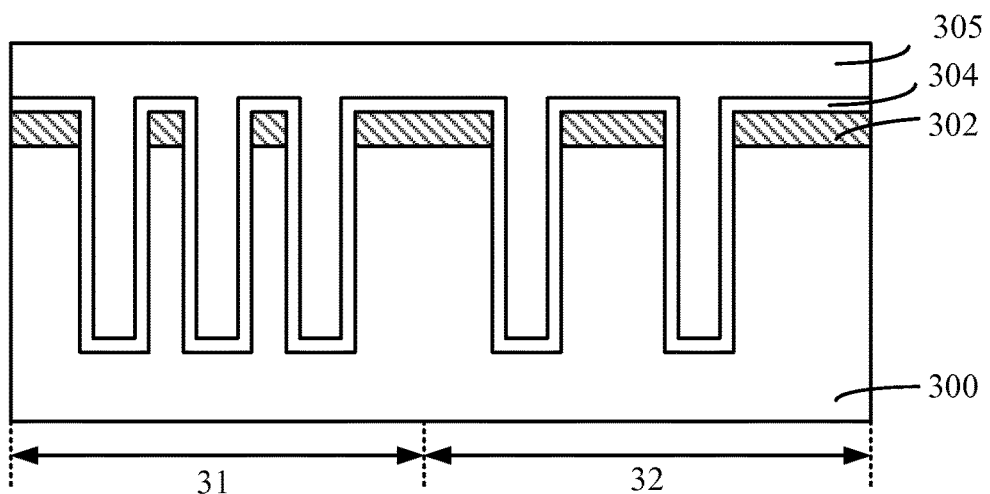
Figure 5:
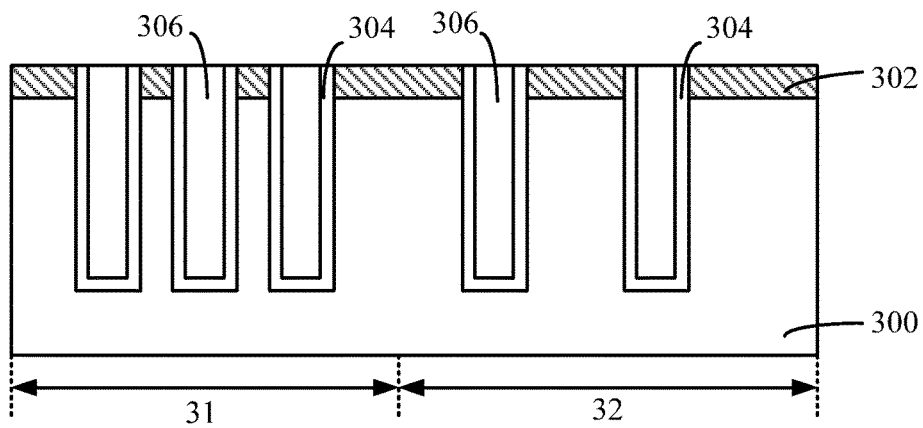
Figure 6:
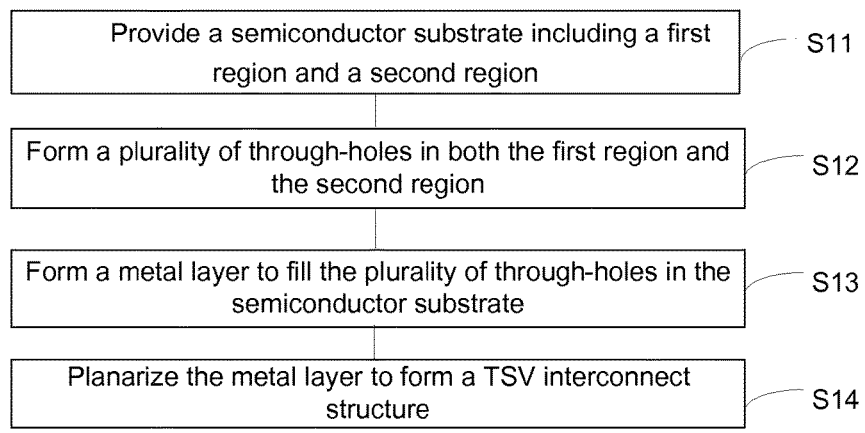
FIG. 6 depicts an exemplary method for forming a TSV interconnect structure in accordance with various disclosed embodiments.

FIGS. 1-5 depict an exemplary TSV interconnect structure at various stages during its formation, and FIG. 6 depicts an exemplary method for forming the TSV interconnect structure in accordance with various disclosed embodiments.

Figure 1:
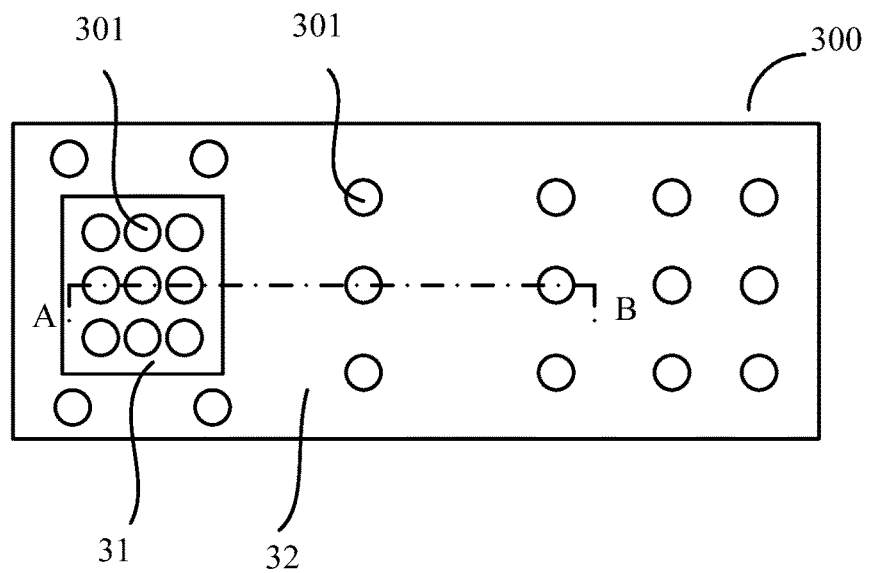
FIGS. 1-5 are schematics of a TSV interconnect structure at various stages during formation in accordance with various disclosed embodiments.
Figure 2:
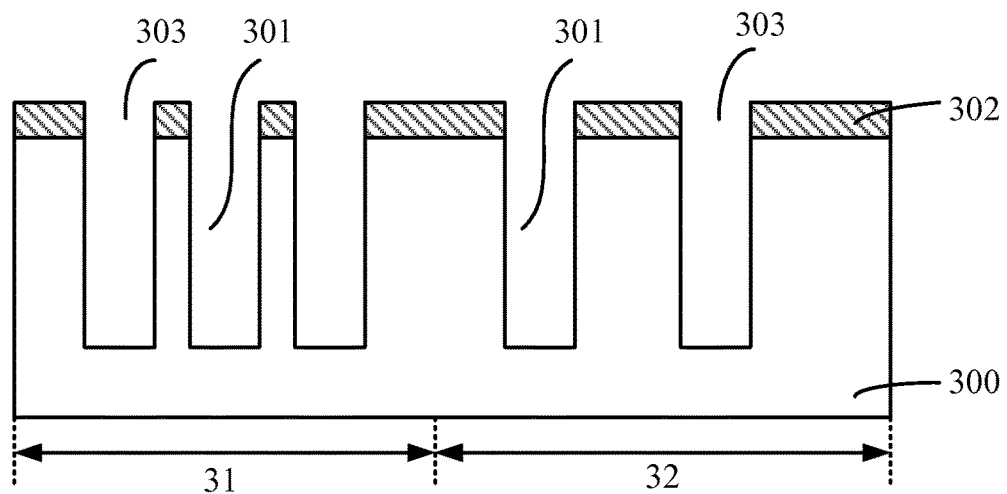

FIG. 1 depicts a top view of the TSV interconnection structure and FIG. 2 depicts a cross sectional view of the TSV interconnection along an A-B direction shown in FIG. 1. As shown in FIGS. 1-2, a semiconductor substrate 300 is provided and includes a first region 31 and a second region 32 (e.g., Step S11 in FIG. 6). In one example, the first region 31 and the second region 32 can cover the entire area of the semiconductor substrate 300 along a surface of the semiconductor substrate 300. For example, the second region 32 can cover all areas other than the first region 31 of the semiconductor substrate 300.

The semiconductor substrate 300 can be etched to form discrete through-holes 301 in both the first region 31 and the second region 32 of the semiconductor substrate 300 (e.g., Step S12 in FIG. 6). The first region 31 can have an average density of through-holes 301 greater than the entire semiconductor substrate. An average density of the entire semiconductor substrate can be less than or equal to about 2%.

The average density of through-holes in the first region 31 is defined by a ratio of opening areas of all of the through-holes 301 in the first region 31 over a surface area of the first region 31 in the semiconductor substrate 300. The average density of through-holes of the entire semiconductor substrate is defined by a ratio of opening areas of all of the through-holes 301 in both the first region 31 and the second region 32 over a total surface area of the semiconductor substrate 300.

The semiconductor substrate 300 can be made of a material including, e.g., silicon, germanium, silicon-germanium, silicon carbide, gallium nitride, and/or silicon-on-insulator (SOI).

Any configurations for the first region 31 and the second region 32 can be included. For example, the second region 32 can be configured on one (or two or three) side(s) of the first region 31 or can be configured to surround the first region 31, or vice versa. In one embodiment, the semiconductor substrate 300 can include the first region 31 and the second region 32 covering the entire region of the semiconductor substrate 300. The discrete through-holes 301 formed in the first region 31 of the semiconductor substrate 300 can have same or different opening areas. The average density of through-holes in the first region 31 is defined by a ratio of the opening areas of all of the through-holes 301 in the first region 31 over the surface area of the first region 31.

In an example shown in FIG. 1, the first region 31 can have nine through-holes 301, the average density of through-holes in the first region 31 can be defined by a ratio of the opening areas of all of the nine through-holes 310 in the first region 31 over the surface area of the first region 31. The average density of through-holes of the entire semiconductor substrate can be defined as a ratio of the opening areas of both the nine through-holes 301 in the first region 31 and the sixteen through-holes 301 in the second region 32 over a total surface area of the semiconductor substrate 300. Note that the size and layout of the first region 31 and the second region 32, as well as the quantity and position of the through-holes 310 shown in FIG. 1 are for illustration purposes and are not limited in any manner according to various embodiments.

The average density of through-holes in the first region 31 greater than the average density of through-holes in the entire semiconductor substrate (e.g., which is less than or equal to about 2%) can be a critical condition for a relationship between the TSV density in the first region 31 and in the semiconductor substrate 300. Such critical condition can satisfy density distribution requirements for through-holes 301 and can also reduce/eliminate differences in material hardness between the first region 31 and the second region 32 after a subsequent filing of metal in the through-holes 301. The difference of polishing rate due to the density difference of through-holes in different regions can be reduced/eliminated during a chemical mechanical polishing process. Metal residues can be prevented from remaining on the surface of the first region 31 after polishing. The surface uniformity of the TSV interconnect structure can be provided with enlarged latitude for processing.

Further, the area of the first region 31 can significantly affect the difference of the average through-hole density between the first region 31 and the semiconductor substrate 300, which can in turn affect the difference of polishing rate in the first region 31 and the second region 32. To further reduce/eliminate the difference of the polishing rate due to the through-hole density difference during the subsequent chemical mechanical polishing process and to prevent metal residues from remaining on the surface of the first region 31 after polishing, various embodiments provide examples as follows.

In one embodiment, when the surface area of the semiconductor substrate 300 in the first region 31 is less than or equal to about 28 mm$^2$ but greater than about 14 mm$^2$, the difference of the average through-hole density between the first region 31 and the entire semiconductor substrate 300 is less than or equal to about 1.25% and the average through-hole density of the entire semiconductor substrate 300 is less than or equal to about 2%.

In another embodiment, when the surface area of the semiconductor substrate 300 in the first region 31 is less than or equal to about 14 mm$^2$ but greater than about 3 mm$^2$, the difference of the average through-hole density between the first region 31 and the entire semiconductor substrate 300 is less than or equal to about 2.75% and the average through-hole density of the entire semiconductor substrate 300 is less than or equal to about 2%.

In another embodiment, when the surface area of the semiconductor substrate 300 in the first region 31 is less than or equal to about 3 mm$^2$ but greater than about 0.5 mm$^2$, the difference of the average through-hole density between the first region 31 and the entire semiconductor substrate 300 is less than or equal to about 4.75% and the average through-hole density of the entire semiconductor substrate 300 is less than or equal to about 2%.

In another embodiment, when the surface area of the semiconductor substrate 300 in the first region 31 is less than or equal to about 0.5 mm$^2$ but greater than about 0.16 mm$^2$, the difference of the average through-hole density between the first region 31 and the entire semiconductor substrate 300 is less than or equal to about 6.75% and the average through-hole density of the entire semiconductor substrate 300 is less than or equal to about 2%.

In another embodiment, when the surface area of the semiconductor substrate 300 in the first region 31 is less than or equal to about 0.16 mm$^2$ but greater than 0 mm$^2$, the difference of the average through-hole density between the first region 31 and the entire semiconductor substrate 300 is less than or equal to about 13.75% and the average through-hole density of the entire semiconductor substrate 300 is less than or equal to about 2%.

In this manner, as depicted in the above exemplary embodiments, various configurations can be provided, regardless of the area size of the first region 31, to allow average through-hole density between the first region 31 and the entire semiconductor substrate 300 to be critical to significantly reduce or eliminate the difference of polishing rate due to the density difference in different regions in the subsequent chemical mechanical polishing process to avoid metal residues remaining on the surface of the first region 31 after polishing.

Although FIG. 1 shows one first region 31, the exemplary semiconductor substrate can include any number (e.g., two or more than two) of the first regions having the same or different surface areas. However, the relationship of the through-hole density between the first regions 31 (e.g., having different areas) and the semiconductor substrate 300 should satisfy a corresponding relationship between the first region 31 and the semiconductor substrate 300 as depicted in the above exemplary embodiments. When the semiconductor substrate 300 includes multiple first regions 31, e.g., with the same or different areas, the difference of the polishing rate between the first regions 31 and the second region(s) 32 can be reduced by providing a critical relationship of average through-hole density between the first regions 31 and the entire semiconductor substrate 300 to prevent metal residues from remaining on the surface of the first region(s) 31.

In an exemplary embodiment, the total surface area of the first region 31 and the second region 32 in the semiconductor substrate 300 can be the same as the area of a single chip. The semiconductor substrate 300 can be a die formed on a wafer, while the distribution of through-holes 301 laid out on each die on the wafer can be the same.

Referring to FIG. 2, a mask layer 302 (not shown in FIG. 1) is formed on the surface of the semiconductor substrate 300 prior to etching the semiconductor substrate 300. The mask layer 302 is used as a mask to subsequently etch the semiconductor substrate 300. The mask layer 302 can also be used as a barrier layer in a subsequent chemical mechanical polishing process. A plurality of openings 303 are formed in the mask layer 302 having a position and a width corresponding to the position and width of the formed through-holes 301.

The mask layer can be made of silicon nitride, silicon oxide, silicon carbide, silicon oxynitride, boron nitride, and/or amorphous carbon. The thickness of the mask layer 302 can be determined according to a practical process.

In some embodiments, a dielectric layer can be formed between the semiconductor substrate 300 and the mask layer 302, and semiconductor devices can be formed on the semiconductor substrate 300 and/or in the dielectric layer. Such semiconductor devices can be subsequently connected to other semiconductor devices on another semiconductor substrate by TSV interconnect structure to be formed. Each of the semiconductor devices can include, but is not limited to, a transistor, capacitor, inductor, resistor, memory/storage device, and interconnect structure.

In an exemplary embodiment, the etching process for etching the semiconductor substrate 300 by using the mask layer 302 as mask can include a Bosch etching process to for through-holes 301 with desired opening morphology and sidewall morphology to prevent difference of the opening morphologies from affecting average through-hole density in each of the first region 31 and the entire semiconductor substrate 300. Thus, the difference of the average through-hole density between the first region 31 and the semiconductor substrate 300 can be reduced/eliminated to provide critical relationship of the average through-hole density between the first region 31 and the semiconductor substrate 300 for prevention of metal residues after polishing.

For example, the Bosch etching process can include an alternating process of an etching step and a polymer deposition step. First, the etching step is conducted to etch away a partial thickness of the semiconductor substrate 300 by a plasma etching process to form etched holes. The plasma etching gas can be, e.g., $SF_6$, and the etching time can range from about 1 second to about 3 seconds and the etching depth can be less than about 1 μm. Then, the polymer deposition step is performed to form a polymer on the sidewall of the etched holes, and the gas used for depositing polymer is $C_4F_8$. The deposited polymer is used to protect the formed sidewall of the etched holes from being etched during the next etching process to ensure the anisotropy of the entire etching process. The plasma etching process and the polymer deposition step can be alternatingly performed until the through-holes 301 are formed.

Figure 3:
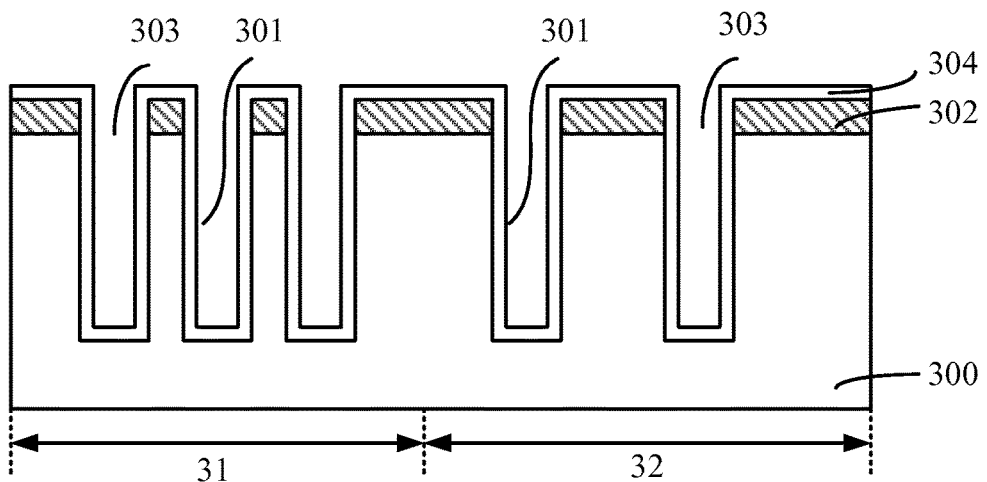

Referring to FIG. 3, a barrier layer 304 is formed on the bottom surface and the sidewall of the through-holes 301 as well as on the surface of the mask layer 203. The barrier layer 304 can prevent metal in the subsequently formed TSV interconnect structures from diffusing into the semiconductor substrate 300 and/or into the dielectric layer and from affecting the stability of the semiconductor devices.

The barrier layer 304 can be made of one or more of Ti, Ta, TiN, TaN, TiAl, TaC, TaSiN, and TiAlN. The barrier layer 304 can be formed by an atomic layer deposition process, a chemical vapor deposition, a sputtering process, etc.

In some cases, an insulation layer (not shown) can also be formed on the sidewall and the bottom of through-holes 301 having the barrier layer 304 formed thereon, such that the insulation layer can electrically isolate the barrier layer 304 from the semiconductor substrate 300. In one embodiment, the insulation layer can be made of silicon oxide using a thermal oxidation method or a chemical vapor process.

Referring to FIG. 4, a metal layer 305 is formed on surface of the barrier layer 304 to completely fill the through-holes 301 (e.g., Step S13 in FIG. 6). In various embodiments, the metal layer 305 can be formed by an electroplating process and can be made of copper, tungsten, and/or aluminum. In an exemplary embodiment, the metal layer 305 is made of copper. Optionally, a seeding layer can also be formed on the surface of the barrier layer 304 prior to the electroplating process. When the metal layer 305 is made of tungsten or aluminum, the metal layer 305 can also be formed by a physical vapor deposition process or a sputtering process.

As shown in FIG. 5, a chemical mechanical polishing process is performed to planarize the metal layer 305 (referring to FIG. 4) to form TSV interconnect structures 306 (e.g., Step S14 in FIG. 6). In one embodiment, the chemical mechanical polishing process can use a grinding solution including silicon dioxide having a concentration ranging from about 1.0 g/ml to about 1.2 g/ml. The grinding solution can include a diluting agent, e.g., deionized water, and a PH, e.g., ranging from about 5.5 to about 6.5. The grinding solution can have a flow rate ranging from about 100 ml/minute to about 200 ml/minute. Rotation rate of the polishing pad ranges from about 70 rpm to about 90 rpm and rotation rate of the polishing head ranges from about 80 rpm to about 100 rpm. The polishing pressure ranges from about 15 KPa to about 30 KPa.

The difference of polishing rate between the first region 31 and the second region 32 can be reduced/eliminated when the average through-hole density of both the first region 31 and the semiconductor substrate 300 satisfy the above described critical requirements. This can prevent effectively metal residues from remaining on the surface of the first region 31 to enhance accuracy and efficiency of the polishing process, and can also ensure less or no difference of surface smoothness of the TSV interconnect structures 306 between the first region 31 and the second region 32 to enlarge the latitude of the polishing process.

After the chemical mechanical polishing is performed, the barrier layer 304 can be removed from the surface of the mask layer 302. After the formation of the TSV interconnect structures 306, the semiconductor substrate 300 can be planarized from a bottom side opposing the barrier layer 304 to expose a bottom surface of the TSV interconnect structures 306 such that the bottom of TSV interconnect structures 306 can connect to interconnects or semiconductor devices on another semiconductor substrate.

Accordingly, the disclosure provides a TSV layout structure, as shown in FIG. 1, including a semiconductor substrate 300 having a first region 31 and a second region 32. The first region 31 and the second region 32 cover the entire semiconductor substrate 300. A plurality of through-holes 301 are formed in the first region 31 and the second region 32 of the semiconductor substrate 300. An average through-hole density in the first region 301 is greater than the average through-hole density of the entire semiconductor substrate 300 (e.g., which is less than or equal to about 2%).

In one embodiment, when the surface area of the semiconductor substrate 300 in the first region 31 is less than or equal to about 28 mm$^2$ but greater than about 14 mm$^2$, the difference of the average through-hole density between the first region 31 and the entire semiconductor substrate 300 is less than or equal to about 1.25% and the average through-hole density of the entire semiconductor substrate 300 is less than or equal to about 2%.

In another embodiment, when the surface area of the semiconductor substrate 300 in the first region 31 is less than or equal to about 14 mm$^2$ but greater than about 3 mm$^2$, the difference of the average through-hole density between the first region 31 and the entire semiconductor substrate 300 is less than or equal to about 2.75% and the average through-hole density of the entire semiconductor substrate 300 is less than or equal to about 2%.

In another embodiment, when the surface area of the semiconductor substrate 300 in the first region 31 is less than or equal to about 3 mm$^2$ but greater than about 0.5 mm$^2$, the difference of the average through-hole density between the first region 31 and the entire semiconductor substrate 300 is less than or equal to about 4.75% and the average through-hole density of the entire semiconductor substrate 300 is less than or equal to about 2%.

In another embodiment, when the surface area of the semiconductor substrate 300 in the first region 31 is less than or equal to about 0.5 mm$^2$ but greater than about 0.16 mm$^2$, the difference of the average through-hole density between the first region 31 and the entire semiconductor substrate 300 is less than or equal to about 6.75% and the average through-hole density of the entire semiconductor substrate 300 is less than or equal to about 2%.

In this manner, the disclosure provides a fabrication method of a TSV layout structure and a TSV interconnect structure. When the critical relationship between the average through-hole density in the first region and in the entire semiconductor substrate is sufficiently satisfied as disclosed herein, the polishing rate difference (caused due to the density difference of through-holes in different regions of the semiconductor substrate) generated during the chemical mechanical polishing process can prevent metal residues from remaining on the surface of the first region after polishing. Surface uniformity of the TSV interconnect structures can be achieved with enlarged processing latitude.

Other applications, advantages, alternations, modifications, or equivalents to the disclosed embodiments are obvious to those skilled in the art.

What is claimed is:

1. A method of fabricating a TSV interconnect structure, comprising:
   providing a semiconductor substrate including a first region and a second region that have a total surface area equal to an area of a single chip;
   forming a plurality of through-holes in both the first region and the second region by controlling a difference of an average area ratio of through-holes between the first region and the entire semiconductor substrate, such that a polishing rate difference of a metal layer in the through-holes between the first and second regions is reduced, wherein:
     an average through-hole area ratio of the first region is greater than an average through-hole area ratio of the entire semiconductor substrate and the average through-hole area ratio of the entire semiconductor substrate is less than or equal to about 2%, and
     the second region is a continuous region connecting to the first region and has an average through-hole area ratio less than the first region, and
     through-holes in the first region are closely packed, while through-holes in the second region are loosely packed;
   forming the metal layer to fill the plurality of through-holes in the semiconductor substrate; and
   planarizing the metal layer by a chemical mechanical polishing process to form a TSV interconnect structure, wherein:
   when the semiconductor substrate in the first region has a surface area of less than or equal to about 28 mm$^2$ and greater than about 14 mm$^2$, the difference of the average through-hole area ratio between the first region and the entire semiconductor substrate is less than or equal to about 1.25%,
   when the semiconductor substrate in the first region has the surface area of less than or equal to about 14 mm$^2$ and greater than about 3 mm$^2$, the difference of the average through-hole area ratio between the first region and the entire semiconductor substrate is less than or equal to about 2.75%, when the semiconductor substrate in the first region has the surface area of less than or equal to about 3 mm$^2$ and greater than about 0.5 mm$^2$, the difference of the average through-hole area ratio between the first region and the entire semiconductor substrate is less than or equal to about 4.75%, and when the semiconductor substrate in the first region has the surface area of less than or equal to about 0.5 mm$^2$ and greater than about 0.16 mm$^2$, the difference of the average through-hole area ratio between the first region and the entire semiconductor substrate is less than or equal to about 6.75%.

2. The method according to claim 1, wherein the semiconductor substrate includes two or more first regions having a same or different surface area.

3. The method according to claim 1, wherein the chemical mechanical polishing process uses a grinding solution including: silicon dioxide having a concentration ranging from about 1.0 g/ml to about 1.2 g/ml, a diluting agent including deionized water, and a PH ranging from about 5.5 to about 6.5; and wherein the chemical mechanical polishing process includes a flow rate of the grinding solution ranging from about 100 ml/minute to about 200 ml/minute, a rotation rate of a polishing pad ranging from about 70 rpm to about 90 rpm, a rotation rate of a polishing head ranging from about 80 rpm to about 100 rpm, and a polishing pressure ranging from about 15 KPa to about 30 KPa.

4. The method according to claim 1, further including forming a mask layer on the semiconductor substrate, wherein the mask layer is further used as a stop layer during the chemical mechanical polishing process.

5. The method according to claim 4, wherein the mask layer is made of a material including silicon nitride, silicon oxide, silicon carbide, silicon oxynitride, boron nitride, or amorphous carbon.

6. The method according to claim 1, further including forming a barrier layer on a bottom and a sidewall of each of the plurality of through-holes, wherein the barrier layer is made of a material including Ti, Ta, TiN, TaN, TiAl, TaC, TaSiN, TiAlN, or a combination thereof.

7. The method according to claim 1, wherein the metal layer is formed by an electroplating process and is made of a material including copper, tungsten, aluminum or a combination thereof.

8. The method according to claim 1, wherein when the semiconductor substrate in the first region has the surface area of less than or equal to about 14 mm$^2$ and greater than about 3 mm$^2$, the difference of the average through-hole area ratio between the first region and the entire semiconductor substrate is less than or equal to about 2.75% and greater than 1.25%.

9. The method according to claim 1, wherein when the semiconductor substrate in the first region has the surface area of less than or equal to about 3 mm$^2$ and greater than about 0.5 mm$^2$, the difference of the average through-hole area ratio between the first region and the entire semiconductor substrate is less than or equal to about 4.75% and greater than 2.75%.

10. The method according to claim 1, wherein when the semiconductor substrate in the first region has the surface area of less than or equal to about 0.5 mm$^2$ and greater than about 0.16 mm$^2$, the difference of the average through-hole area ratio between the first region and the entire semiconductor substrate is less than or equal to about 6.75% and greater than 4.75%.

11. The method according to claim 1, wherein when the semiconductor substrate in the first region has the surface area of less than or equal to about 0.16 mm$^2$, the difference of the average through-hole area ratio between the first region and the entire semiconductor substrate is less than or equal to about 13.75% and greater than 6.75%.

12. The method according to claim 1, wherein the second region surrounds the first region to cover a total surface area equal to an area of a single chip.

* * * * *